(12) United States Patent
Zafrany et al.

(10) Patent No.: US 6,677,186 B1
(45) Date of Patent: Jan. 13, 2004

(54) METHOD FOR MAKING AN ELECTRONIC DEVICE SUCH AS A CONTACTLESS CARD

(75) Inventors: Michael Zafrany, Marseille (FR); Philippe Patrice, Allauch (FR)

(73) Assignee: Gemplus, Cedex (FR)

( * ) Notice: Subject to any disclaimer, the term of this patent is extended or adjusted under 35 U.S.C. 154(b) by 0 days.

(21) Appl. No.: 09/936,302

(22) PCT Filed: Mar. 6, 2000

(86) PCT No.: PCT/FR00/00555

§ 371 (c)(1),
(2), (4) Date: Dec. 26, 2001

(87) PCT Pub. No.: WO00/55808

PCT Pub. Date: Sep. 21, 2000

(30) Foreign Application Priority Data

Mar. 12, 1999 (FR) .............................. 99 03102

(51) Int. Cl.⁷ .................. H01L 21/44; H01L 21/48; H01L 21/50
(52) U.S. Cl. .................. 438/125; 438/108; 257/679
(58) Field of Search .............. 257/679, 704, 257/680; 438/108, 125, 126, 456, 106

(56) References Cited

U.S. PATENT DOCUMENTS

| | | | |
|---|---|---|---|
| 4,931,853 A | | 6/1990 | Ohuchi et al. |
| 5,528,222 A | | 6/1996 | Moskowitz et al. |
| 5,566,441 A | * | 10/1996 | Marsh et al. |
| 5,598,032 A | * | 1/1997 | Fidalgo |
| 5,826,328 A | | 10/1998 | Brady et al. |
| 6,036,099 A | * | 3/2000 | Leighton |
| 6,111,303 A | * | 8/2000 | Launay |
| 6,281,048 B1 | * | 8/2001 | Vere et al. |
| 6,319,827 B1 | * | 11/2001 | Kowalski et al. |
| 6,320,753 B1 | * | 11/2001 | Launay |
| 6,374,486 B1 | * | 4/2002 | Brechignac |
| 6,404,643 B1 | * | 6/2002 | Chung |
| 6,406,935 B2 | * | 6/2002 | Kayanakis et al. |

FOREIGN PATENT DOCUMENTS

| | | |
|---|---|---|
| FR | 2756955 | 6/1998 |
| WO | WO9806063 | 2/1998 |

* cited by examiner

*Primary Examiner*—Sheila V. Clark
(74) *Attorney, Agent, or Firm*—Burns, Doane, Swecker & Mathis, L.L.P.

(57) ABSTRACT

A method for making an electronic device having an integrated circuit chip connected to an antenna. A chip is transferred into an impression provided in a substrate made of insulating material. The chip is connected to an antenna by hot lamination of an insulating support-sheet bearing the antenna. The method ensures a high quality electrical connection between the chip and the antenna, and enables the connection of a chip matrix with a plurality of antennae in a large-size circuit to be produced in one single step.

14 Claims, 1 Drawing Sheet

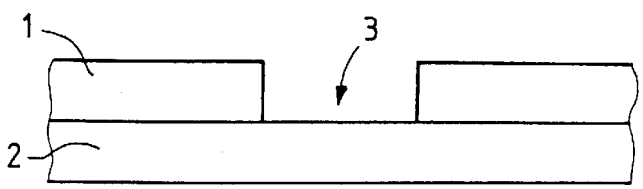
FIG_1a
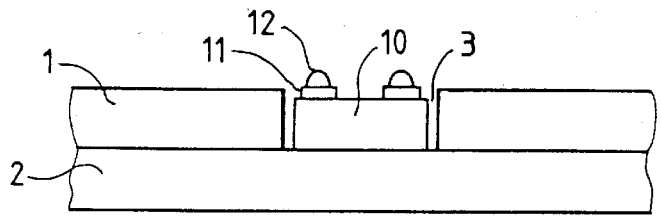
FIG_1b
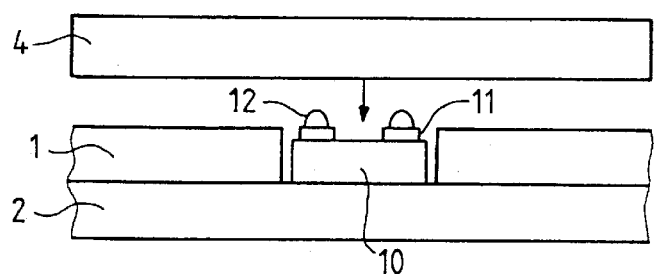
FIG_1c
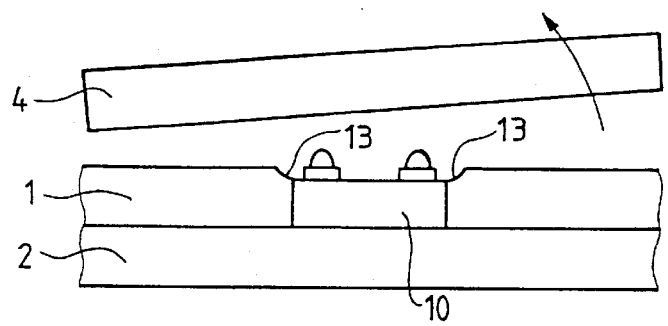
FIG_1d
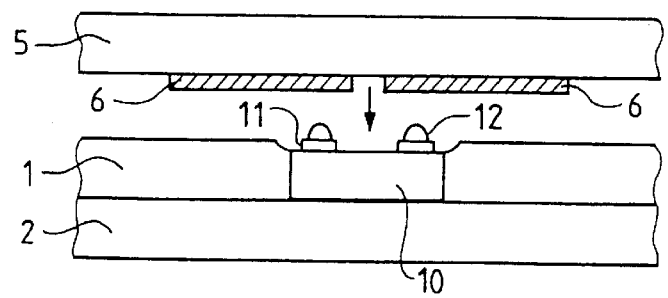
FIG_1e
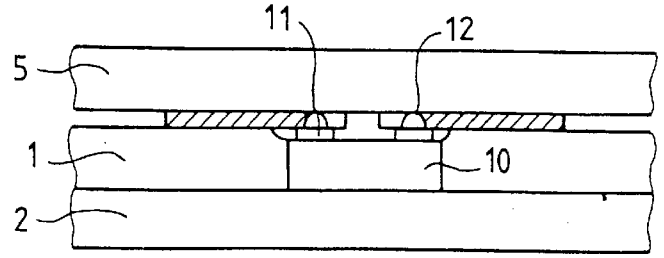
FIG_1f

METHOD FOR MAKING AN ELECTRONIC DEVICE SUCH AS A CONTACTLESS CARD

This disclosure is based upon, and claims priority from French Application No. 99/03102, filed on Mar. 12, 1999 and International Application No. PCT/FR00/00555, filed Mar. 6, 2000, which was published on Sep. 21, 2000 in a language other than English, the contents of which are incorporated herein by reference.

BACKGROUND OF THE INVENTION

The present invention relates to the manufacture of electronic devices having at least one circuit chip embedded in a support and electrically connected to interface elements by connection areas.

These electronic devices constitute for example portable devices such as smart cards, and more particularly cards capable of functioning without contact by means of an antenna integrated into the card, or electronic labels or electronic modules including an antenna.

Such cards are intended to perform various operations such as, for example, banking operations, telephone communications, identification operations, operations of debiting or reloading units of account, and all kinds of operations which can be performed at a distance by high-frequency electromagnetic coupling between a transmission/reception terminal and a card placed in the action area of this terminal.

The labels and electronic modules allow all kinds of identification operations.

One of the main problems which it is necessary to resolve in the manufacture of such devices is the connection of the antenna to the integrated circuit chip providing the electronic functioning of the device.

Another problem which it is necessary to resolve, in the case of a card or label, is the reduction of the thickness of the device to the maximum possible extent.

The classic constraints of mechanical strength, reliability and manufacturing cost must obviously be taken into account in this manufacture.

A known solution of the prior art, described in the PCI document WO 96/07985, for making the connection between the antenna and the integrated circuit chip, consists of forming metallic protrusions on two contact pads on the chip, and then connecting these protrusions to the ends of an antenna wire. In this case, the antenna wire is a copper wire formed on a substrate and the protrusions are applied to this antenna wire by hot compression.

However, the interconnection unit thus obtained has problems of mechanical strength and fragility under traction of the connection. This is because, when the chip is subjected to mechanical stresses, the protrusions suffer damage affecting the quality of the electrical connection. The mechanical stresses can even go as far as causing the rupture of the protrusions and consequently the pulling away of the chip. The contactless smart cards produced according to this prior method therefore have a relatively short life.

In another known solution of the prior art, the connection between the antenna and the chip is effected by means of conductive glue applied between the antenna and metallic protrusions formed on two contact pads on the chip. In this case, however, a significant excess thickness appears because of the presence of the glue and the protrusions. In addition, the manufacture of the card requires an additional step of dispensing dots of glue.

The protrusions, and where applicable the dots of conductive glue, have a not insignificant thickness which is added to that of the antenna and that of the chip, which increases the bulk of the interconnection unit obtained. However, it is sought to obtain an interconnection unit of very small bulk in order to produce an ultraflat contactless smart card, that is to say with a thickness less than the standard ISO thickness. The standard ISO 7810 corresponds to a card with a standard format 85 mm long, 54 mm wide and 0.76 mm thick.

In addition, the use of conductive glue during the connection of the chip to the antenna may, in certain cases, cause electrical malfunctioning in the chip in the event of pouring of the glue onto the sides of the chip.

SUMMARY OF THE INVENTION

The purpose of the present invention is to mitigate the drawbacks of the prior art.

To this end, the present invention proposes to manufacture an electronic device such as a contactless smart card, a label or an electronic module in which at least one chip is directly connected to an antenna by means of metallised protrusions embedded in the thickness of the antenna, at the time the chip is attached to the antenna.

In addition, the method according to the present invention proposes to transfer the chip to an insulating substrate and to package it so as to insulate its sides whilst leaving its contacts appearing on the surface.

The object of the present invention is more particularly a method of manufacturing an electronic device containing at least one integrated circuit chip connected to an antenna, characterised in that it includes the following steps:

transferring a chip into a recess provided in a support made of insulating material;

connecting the chip to an antenna by hot lamination of an insulating sheet carrying the antenna, the connecting pads on the antenna being placed opposite the connecting pads on the chip.

According to one characteristic of the present invention, the impression consists of a perforated insulating sheet, laminated or rolled on a second insulating sheet, the perforation having dimensions greater than those of the chip.

In a variant embodiment the impression is machined in the insulating material.

According to another characteristic, the method according to the invention also includes a step of insulating the sides of the chip.

According to one variant, the insulation of the sides of the chip is effected by distributing an insulating material filling the gap between the edges of the impression and the sides of the chip.

According to a variant embodiment, the insulation of the sides of the chip is effected by spraying an insulating material.

According to another variant, the insulation of the sides of the chip is effected by hot lamination of the material of the insulating support so as to form a melt in the gap between the edges of the impression and the sides of the chip.

According to this last variant, the step of protecting the sides of the chip and the step of connecting the chip to the antenna are performed during a single lamination.

According to another characteristic, the chip has metallic protrusions produced on each contact pad, the antenna being produced from a material able to be softened by thermo-compression.

The metallised protrusions have a substantially conical shape.

According to one characteristic, the insulating sheets have dimensions greater than or equal to the format of the electronic devices to be produced, the insulating sheets being cut, after the step of connecting a plurality of chips to a plurality of antennae, in order to release a plurality of electronic devices.

According to another characteristic, the insulating sheets have dimensions equal to the format of the electronic device to be produced, a chip being connected to an antenna.

The electronic device to be produced is a smart card.

The electronic device to be produced is an electronic label.

The manufacturing method according to the invention has the advantage of protecting the sides of the chip during the interconnection step.

In addition, the method according to the present invention makes it possible to interconnect a matrix of chips to a plurality of antennae in a single operation. This is because it is possible to position a plurality of chips and a plurality of impressions in order to insert a large circuit or a plurality of circuits which are cut after the connection step.

In addition, given that the protrusions are embedded in the thickness of the antenna, the interconnection assembly formed by the chip and antenna has reduced bulk, which is very advantageous for producing an ultraflat electronic module.

BRIEF DESCRIPTION OF THE DRAWINGS

Other particularities and advantages of the invention will emerge from a reading of the description given by way of illustrative and non-limitative example and made with reference to FIGS. 1a to 1f attached, which depict schematically the steps of manufacturing a contactless electronic device according to the present invention.

DETAILED DESCRIPTION

FIGS. 1a to 1f illustrate the steps of connection between a chip 10 and an antenna 6. The interconnection assembly formed by the chip 10 and antenna 6 is intended to be inserted in a contactless smart card with ultrafine thickness less than the standard ISO thickness, or in any other electronic device having an antenna.

For reasons of clarity, the figures and the description which follow refer to a chip and an antenna. However, the present invention also applies to a method of manufacturing a contactless inset circuit containing a plurality of chips and a plurality of antennae.

Referring to FIG. 1a, an impression 3 is produced in an insulating support 1, with a size slightly greater than the size of a chip.

The insulating substrate 1 can consist, for example, of plastic sheets made of polyvinyl chloride (PVC) or polyethylene (PE).

According to the embodiment, this impression 3 can be machined in the insulating support 1 or created by gluing or laminating two insulating sheets 1 and 2 on each other, the sheet 1 having an impression 3 in it. These sheets 1 and 2 are preferentially cut to the format of the card or circuit which it is wished to produce.

FIG. 1b illustrates the transfer of a chip 10 into the impression 3 in the sheet 1. This transfer is effected, with the active face upwards, according to any known technique. The contacts 11 of the chip 10 appear on the surface of the insulating sheet 1.

A preliminary step of the manufacturing method according to the invention consists of forming metallised protrusions 10 on contact pads 11 of the chip 10. The protrusions 12 are intended to provide the electrical connection between the chip 10 and the antenna 6. They are consequently necessarily produced from a conductive material. They can for example be produced from gold, or from a polymer material loaded with metallic particles.

Preferably the protrusions 12 are produced on the two contact pads 11 of the chip 10 in order to be able to produce a connection on conductive areas of the antenna 6 situated at its ends.

Given that the protrusions 12 are intended to be embedded in the thickness of the antenna 6, they preferably have a thickness approximately equal to, or slightly less than, that of the antenna. In addition, to allow good penetration of the protrusions 12 into the thickness of the antenna 6, it is preferred that they have a substantially conical shape.

If the edge of the chip 10 is conductive, it is advantageous to effect an insulation of its sides. This step is not necessary when a type of chip 10 is used whose edges are not conductive by nature, and are consequently already insulated.

FIGS. 1c and 1d illustrate a particular method for effecting the insulation of the sides of the chip 10. According to this embodiment, a sheet 4 is hot laminated on the assembly consisting of insulating sheets and chip. This sheet 4 is advantageously of such a nature as not to adhere to the insulating sheets 1 and 2 defining the impression 3.

It may be envisaged using a lamination mat in place of the sheet 4.

According to a particularity of the invention, the hot lamination on the assembly consisting of insulating sheets and chip, effected by a mat or by a sheet 4, makes it possible to assist the spreading of the partially melted material of the insulating sheet 4 so as to insulate the sides of the chip 10. This is because a pouring 13 of the material of the sheet 1 makes it possible to block the gap left between the chip 10 and the impression 3, slightly larger than the latter.

The chip 10 is thus embedded in an insulating substrate consisting of the two sheets 1 and 2, with the contact pads 11 and its protrusions 12 appearing on the surface of the sheet 1.

According to a variant embodiment, it is possible to effect the insulation of the sides of the chip 10 by the distribution or spraying of an insulating material filling the gap between the edges of the impression 3 and the sides of the chip 10.

Referring to FIG. 1e, an antenna 6 is produced on an insulating support 5.

The insulating support 5 consists for example of a plastic sheet to a format of the smart card or of the circuit to be produced. It may for example be composed of polyvinyl chloride (PVC) or polyethylene (PE).

The antenna 6 is produced from a conductive material able to be softened at the time it is connected to the chip 10, to allow better penetration of the protrusions 12. Its shape is of little importance, and may for example represent a spiral or any other pattern.

A first embodiment consists of producing the antenna 2 from a thermoplastic material containing metallic particles. The antenna is formed in this case by screen printing with conductive ink based on thermoplastic. The metallic particles consist for example of small balls of silver.

The sheet 5 is hot laminated on the sheets 1 and 2 The addition of heat softens the thermoplastic material constituting the antenna 6, and the lamination facilitates the penetration of the protrusions 12 in the thickness of the antenna with a view to effecting the connection of the chip 10 to the antenna 6. When the lamination operation is terminated, the interconnection assembly obtained is left to cool in ambient air to enable the material of the antenna to regain its solid state and its initial shape. The thermoplastic antenna generally has adhesive properties during its softening which make it possible to fix the chip.

In a variant embodiment, the antenna 6 is produced from a conductive thermosetting polymer material, that is to say one containing metallic particles. In this case, it is ensured that the antenna material is not polymerised before the step of connecting the chip to the antenna, so that this material is in a viscous state.

The hot lamination then on the one hand facilitates the penetration of the protrusions 12 into the thickness of the material of the antenna 6, and on the other hand polymerises the thermosetting material constituting the antenna 6 in order to harden it.

FIG. 1f illustrates the interconnection assembly obtained by the method according to the present invention.

By virtue of the manufacturing method according to the invention, it is possible to manufacture electronic devices such as labels or contactless smart cards with ultrafine thickness. The thickness of the device obtained is in fact equal to the sum of the thicknesses of the three plastic sheets 1, 2 and 5, and of the antenna 6, the chip 10 being embedded in the sheet 1, and the protrusions 12 being embedded in the thickness of the antenna 6.

In addition, the protrusions 12 being completely embedded in the thickness of the antenna 6, there is no risk of their being damaged by mechanical stresses. The interconnection assembly obtained therefore has very good mechanical strength and increased life.

In addition, it is possible, using the method of the present invention, not to work solely to the format of a card, but to a larger format and then to cut out a plurality of cards.

It is thus possible, in a single operation, to connect a matrix of chips to a matrix of antennae and to effect their insetting.

The method according to the invention, implemented using large insulating sheets 1, 2, 5, allows a precise positioning of the sheets with respect to each other, and therefore a precise positioning of the contact pads on the chips with respect to the connection pads on the antennae.

What is claimed is:

1. A method of manufacturing an electronic device containing at least one integrated circuit chip connected to an antenna, comprising the following steps:

attaching the chip in an indentation provided in a support made from insulating material, said chip having connection pads with protrusions; and connecting said chip to the antenna by hot laminating an insulating sheet carrying said antenna to the support such that said protrusions are embedded in the thickness of connection pads for said antenna during said hot laminating.

2. A manufacturing method according to claim 1, wherein the indentation comprises a perforated insulating sheet bonded onto a second insulating sheet, wherein the perforation has dimensions greater than those of the chip.

3. A manufacturing method according to claim 1, wherein the indentation is produced by machining in the insulating material.

4. A manufacturing method according to claim 1, further including a step of insulating the sides of the chip.

5. A manufacturing method according to claim 4, wherein the insulation of the sides of the chip is effected by distributing an insulating material within a gap between the edges of the indentation and the sides of the chip.

6. A manufacturing method according to claim 4, wherein the insulation of the sides of the chip is effected by spraying an insulating material in a gap between the edges of the indentation and the sides of the chip.

7. A manufacturing method according to claim 4, wherein the insulation of the sides of the chip is produced by hot rolling the material of the insulating support so as to form a casting in a gap between the edges of the indentation and the sides of the chip.

8. A manufacturing method according to claim 7, wherein the step of insulating the sides of the chip and the step of connecting the chip to the antenna are performed during a single lamination.

9. A manufacturing method according to claim 1, wherein the chip has metallic protrusions on each connection pad, the antenna being produced from a material able to be softened by thermocompression.

10. A manufacturing method according to claim 9, wherein the metallised protrusions have a substantially conical shape.

11. A manufacturing method according to claim 1, wherein the insulating material comprises one or more sheets having dimensions greater than or equal to the format of the electronic device to be produced, said insulating sheets being cut, after connecting a plurality of said chips to a plurality of said antennae, to produce a plurality of electronic devices.

12. A manufacturing method according to claim 1, wherein the insulating material comprises one or more sheets that have dimensions equal to the format of the electronic device to be produced.

13. A manufacturing method according to claim 12, wherein the electronic device to be produced is a smart card.

14. A manufacturing method according to claim 12, wherein the electronic device to be produced is an electronic label.

* * * * *